United States Patent
Moelle et al.

(10) Patent No.: US 7,381,469 B2
(45) Date of Patent: *Jun. 3, 2008

(54) COATED OBJECT

(75) Inventors: Christoph Moelle, Bad Gandersheim (DE); Lars Bewig, Bad Gandersheim (DE); Frank Koppe, Bad Gandersheim (DE); Thomas Küpper, Bad Gandersheim (DE); Stefan Geisler, Northeim (DE); Stefan Bauer, Alzey (DE); Jürgen Dzick, Nieder-Olm (DE)

(73) Assignee: Schott AG, Mainz (DE)

( * ) Notice: Subject to any disclaimer, the term of this patent is extended or adjusted under 35 U.S.C. 154(b) by 285 days.

This patent is subject to a terminal disclaimer.

(21) Appl. No.: 10/829,419

(22) Filed: Apr. 21, 2004

(65) Prior Publication Data

US 2004/0258947 A1   Dec. 23, 2004

Related U.S. Application Data

(63) Continuation of application No. PCT/EP03/10220, filed on Sep. 13, 2003.

(30) Foreign Application Priority Data

Sep. 14, 2002   (DE) ............................. 102 42 848

(51) Int. Cl.
*B32B 17/06* (2006.01)
(52) U.S. Cl. .................. 428/432; 428/698; 428/699; 428/701; 428/702; 428/704
(58) Field of Classification Search ............... 428/432, 428/698, 699, 701, 702, 704
See application file for complete search history.

(56) References Cited

U.S. PATENT DOCUMENTS

| | | | |
|---|---|---|---|
| 4,321,311 A | | 3/1982 | Strangman ................. 428/623 |
| 4,643,951 A | * | 2/1987 | Keem et al. ................ 428/469 |
| 5,594,231 A | | 1/1997 | Pellicori et al. ........ 235/462.32 |
| 5,930,046 A | * | 7/1999 | Solberg et al. ............. 359/580 |
| 5,944,964 A | | 8/1999 | Solberg et al. ........ 204/192.26 |
| 6,579,590 B2 | * | 6/2003 | Ju et al. .................. 428/848.8 |
| 6,797,388 B1 | * | 9/2004 | Szanyi et al. ............... 428/432 |
| 7,018,727 B2 | * | 3/2006 | Dzick ....................... 428/699 |

FOREIGN PATENT DOCUMENTS

| | | |
|---|---|---|
| DE | 42 01 914 | 7/1992 |
| DE | 201 06 167 | 7/2001 |
| EP | 0548972 | 6/1993 |

OTHER PUBLICATIONS

Klinger, R. E., "Evolution of Surface Roughness and Scatter in Evaporated Zirconia/Silica Multilayer Coatings," Proceeding of the Spie, Spie, Bellingham, VA, US, vol. 678, pp. 41-50, 1986.
Selhofer, H. et al., "Comparison of Pure and Mixed Coating Materials for AR Coatings for Use by Reactive Evaporation on Glass and Plastic Lenses," Thin Solid Films, Elsevier-Sequoia S.A. Lausanne, VH, vol. 351, No. 1-2, pp. 180-183, Aug. 30, 1999.
International Preliminary Examination Report dated Dec. 14, 2004 (English translation).

* cited by examiner

*Primary Examiner*—Gwendolyn Blackwell
(74) *Attorney, Agent, or Firm*—Ohlandt, Greeley, Ruggiero & Perle L.L.P.

(57) ABSTRACT

The invention relates to a coated object in which coatings remain of a constant and unchanged high quality despite operating temperatures of more than 350° C. This is achieved with interlayers which deliberately interrupt and thereby stabilize the morphology of the coating.

21 Claims, 2 Drawing Sheets

COATED OBJECT

CROSS REFERENCE TO RELATED APPLICATIONS

This application is a continuation of International application Ser. No. PCT/EP03/10220 filed Sep. 13, 2003.

BACKGROUND OF THE INVENTION

1. Field of the Invention

The invention relates to a coated object comprising a substrate and at least one functional layer with an optical function and/or a protective function, and to processes for producing a coated object of this type and also to the uses of this object.

2. Description of Related Art

Coated objects of this type have been known for many years and are indeed in widespread use. For many applications, it is necessary to apply very thin layers, in ranges of up to a few micrometers. These coatings may have a very wide range of different functions. So there are numerous very thin protective layers for protecting the object from, for example, mechanical loads, in the form of "scratch-resistant layers", etc. These layers are often also supposed to have an optically attractive design and/or to be completely transparent. A further wide range of applications for coatings is formed by optical coatings having numerous functions and applications.

However, with many objects of the type described in the introduction, problems arise if they are exposed to operating temperatures of higher than approx. 350° C.

Reflectors, for example, have an operating temperature of approximately 400 to 500° C., while cooking hobs have operating temperatures of up to 800° C.

At these high temperatures, layers applied in amorphous form change. As the temperatures rise, the layers undergo a phase transformation, which is highly detrimental to the functioning of the coated objects. For example, in the case of $TiO_2$, the phase transformation is from the amorphous phase to the crystalline anatase phase and then from the anatase phase into the rutile phase. This phase transformation involves volumetric shrinkage, which has extremely adverse effects on the overall layer assembly. On account of the volumetric shrinkage, microcracks are formed within the layer. By way of example, in the case of reflectors these microcracks then scatter the incident radiation, with the result that the maximum reflected light flux which can be achieved is reduced. The reflectivity of the coating is also reduced. The surface structure of the individual layers also changes as a result, which in the case of alternating layer systems may have further adverse effects, such as for example (partial) delaminations.

It is known, in order to solve this problem, to apply the layers directly in crystalline form. However, these layers are often rough, somewhat opaque and have worse reflection characteristics.

One further possible way of avoiding the problem is to dope a functional layer with an $SiO_2$ glass-forming agent. A drawback of this process is that the functional layer has a lower refractive index and that the procedure is more complex to carry out. More or thicker layers and, as a corollary effect, more time to build up the layer assembly are required to achieve the same optical effect (reflection).

There are studies on phase transformations and crystallization properties of thin (alternating) layers. For example, it is known from the literature [H. Sankur and W. Gunning, J. Appl. Phys. 66 (1989)] that the crystallization properties are dependent on the one hand on the temperature but also on the other hand on the layer thickness of the individual layers. The thicker the layers are and the more the layers are heated, the more likely crystallization is to occur.

H. Sankur and W. Gunning discovered that layers of $TiO_2$ crystallize from the amorphous phase to the anatase phase at approximately 350° C. and then crystallize into the rutile phase at approximately 600° C. and above. Their studies have shown that with very pure layers, below a certain layer thickness, namely less than approx. 50 nm, the crystallization is made so much more difficult, even at relatively high temperatures, that in actual fact it simply does not occur.

A further study on this topic by D. G. Howitt and A. B. Harker [J. Mater, Res. 2 (2), March/April 1987] shows that relatively thin layers (<50 nm) do not crystallize, i.e. remain in the amorphous state, even if they are heated for a relatively long time at elevated temperatures. For example, heating a thin layer (<50 nm) at 450° C. for 100 hours did not reveal any crystallization. Under these conditions, thicker layers would crystallize within a few minutes.

With a view to the optical design, however, it is generally necessary to apply layers which have a thickness of greater than 50 nm. In this respect, the optical design stipulates a certain layer structure, i.e. an accurately defined sequence of the physical layer thicknesses d in the alternating layer assembly, the values of which thicknesses may typically be up to 200 nm for applications in the visible spectral region. The corresponding optical layer thicknesses n-d are of the order of magnitude of $\lambda/4$ (n: refractive index, $\lambda$: light wavelength).

Furthermore, it has been found that with the known processes it is impossible to produce sufficiently thermally stable layers which are hard, dense and scratchproof, in particular if they are also supposed to have an attractive optical appearance in the long term and/or have to be transparent.

By way of example, it is known from DE 42 01 914 A1 (=U.S. Pat. No. 5,594,231) to provide scanning windows made from glass or glass-ceramic for scanning systems installed in checkouts of supermarkets and other consumer markets to record barcodes which have been applied to product packaging, with a light-transmitting hard-material layer on the top side, and in turn to apply a light-transmitting coating with sliding properties to the hard-material layer, in order to make these scanning windows more resistant to wear. Materials which may be mentioned for the hard-material layer include, inter alia, metal oxides, such as $Al_2O_3$, $ZrO_2$, $SnO_2$, $Y_2O_3$. Aluminum oxide deposited in amorphous form is mentioned as being particularly suitable. In particular the amorphous deposition of the metal oxide in this context promotes the desired improved hardness and sliding properties of the protective layer. The hard-material layers described here are suitable for applications in the region of room temperature, but their properties change at high temperatures, as are customary, for example, in cooking areas, making them unsuitable for use at high temperatures. A protective layer for cooking areas requires materials which are able to withstand temperatures of up to 800° C. and which are also able to withstand the high thermomechanical stresses which occur between the glass-ceramic and protective layer.

DE 201 06 167 U1 has disclosed a cooking area having a glass-ceramic plate as the cooking plate, which is provided with a transparent scratch-resistant layer which may be formed, inter alia, by a hard-material layer. Materials which are mentioned for this transparent layer include, inter alia, metal oxides, such as aluminum oxide, zirconium oxide, yttrium oxide, tin oxide, indium oxide and combinations thereof. According to this document, the materials can be deposited, for example, by the sol gel technique, the CVD processes, in particular the PICVD process, and by sputtering.

With the known processes for producing hard-material layers, as described, for example, in the abovementioned documents DE 42 01 914 A1 and DE 201 06 167 U1, the layers are typically deposited in amorphous form or in a partially crystalline structure. In the event of prolonged use in the hot areas or in the event of their maximum thermal load being reached, layers of this type may experience disadvantageous changes. For example, in these areas the layers may be discolored by thermally induced compacting or may become partially opaque through crystallization, with the result that the hot areas become visually noticeable. Furthermore, roughening in the range from 1-1000 nm may occur. The roughening itself may already make its optical presence felt, with the recesses which are formed additionally making them more difficult to clean. The problem of crystallization in the hot areas intensifies mechanical failure mechanisms of the scratch-resistant layer. During crystallization, the structure of the layer changes, so that cracks are formed in the layer. The loss of lateral cohesion means that the layer no longer offers sufficient protection against scratching.

It is known from the application area of turbine technology that layers which are grown in pillar form have a particularly high resistance to rapid alternating thermal loads. For example, U.S. Pat. No. 4,321,311 describes the use of a ceramic layer grown in columnar form as thermal protection for metallic components of the turbine structure. However, the layers described in this document have a considerable roughness and/or porosity, on account of their coarse crystalline structures.

Rough and porous surfaces quickly become dirty and are difficult to clean. Moreover, in optical terms they are not fully transparent, but rather have a strong scattering action and are unsuitable for applications with optically attractive surfaces.

SUMMARY OF THE INVENTION

The invention is therefore based on the object of providing coated objects of the type described in the introduction at the minimum possible cost and in a high quality, with the coating being structurally stable even at operating temperatures of over 350° C., and with its optical and/or mechanical properties also being improved further.

According to the invention, at least one functional layer of the coated object has at least one interlayer, the interlayer being a layer which is very thin compared to the functional layer, with a layer thickness $d_z \leq 10$ nm, and the interlayer interrupting the morphology of the functional layer, so that the drawbacks of the prior art no longer occur.

The term functional layers refers to layers which fulfill an optical function (i.e. these layers, on account of the choice of refractive index and of layer thickness, have a function in terms of their action on the radiation within a defined region of the electromagnetic spectrum) and/or have a protective function with respect to the substrate, for example protecting against thermal, chemical or mechanical actions.

If the functional layer is a predominantly amorphous layer or a layer in an unstable crystal phase, the interlayer can interrupt the morphology of a functional layer of this type at least once, in such a manner that the partial layers $T_i$ of the functional layer which are formed remain below a predetermined layer thickness at which a phase transformation, for example from the amorphous phase to the anatase crystalline phase or from the anatase phase to the rutile crystalline phase, of the functional layer no longer occurs.

Surprisingly, it has emerged that the thin interlayers cause a positive change to the morphology, for example of functional layers which are known per se, in terms of their thermal stability without adversely affecting the original functions of these functional layers. This makes it possible, for example, to make amorphous functional layers or functional layers in thermally unstable crystal phases with advantageous mechanical and optical properties structurally and thermally stable as well, so that they can be used even in high-temperature ranges.

If the functional layer is a predominantly crystalline layer, preferably in a thermally stable crystal phase, the interlayer can interrupt the morphology of a functional layer of this type at least once, so that partial layers $T_i$ are formed. The result of the interruption is that dense columns which are laterally tightly cohesive, grow perpendicular to the substrate surface and have substantially no tendency to widen out are formed in the functional layer.

The interlayers mainly influence the morphology of the crystalline layers in such a manner that the interlayers suppress crystal orientations which have a tendency to widen out as the layer grows, so that the functional layers are very dense and have very smooth surfaces. As a result, it is possible to impart high-quality optical properties to crystalline layers with a high thermal stability, thereby producing very dense, scratch-resistant and thermally stable layers.

Furthermore, a combined action of the influences of the interlayers described above on functional layers is also possible.

The functional layer may contain an oxide, nitride, carbide, fluoride, chloride, selenide, telluride or sulfide and/or may contain compounds of one or more of the following elements Li (lithium), Be (beryllium), Na (sodium), Mg (magnesium), Al (aluminum), Si (silicon), Ca (calcium), Sc (scandium), Ti (titanium), Cr (chromium), Zn (zinc), Ge (germanium), Sr (strontium), Y (yttrium), Nb (niobium), Cd (cadmium), In (indium), Sn (tin), Sb (antimony), Te (tellurium), La (lanthanum), Ce (cerium), Pr (praseodymium), Nd (neodymium), Sm (samarium), Gd (gadolinium), Yb (ytterbium), Lu (lutetium), Hf (hafnium), Zr (zirconium), Ta (tantalum), Tl (thallium), Pb (lead), Bi (bismuth) and/or Th (thorium).

Furthermore, however, the functional layer may also consist of a pure material of the abovementioned elements or of mixed systems comprising oxide and/or nitride and/or carbide and/or fluoride and/or chloride and/or selenide and/or telluride and/or sulfide compounds of the elements, for example may consist of mixed systems having at least one metal oxide and/or metal nitride and/or metal carbide and/or metal oxynitride and/or metal carbonitride and/or metal oxycarbonitride. It is also possible for the abovementioned mixed systems to contain a plurality of metallic components, for example to consist of titanium aluminum oxide.

The coatings may comprise either just one functional layer or a plurality of different functional layers. The choice of materials and materials combinations, the structure and the composition of the individual functional layers is substantially determined by the demands imposed on the particular layer.

The interlayers may likewise contain the elements, compounds and mixed systems which have been mentioned above in connection with the functional layers.

An effective interruption to the morphology of the functional layers by the thin interlayers can advantageously be achieved if the interlayer has a different chemical composition and/or a different morphology than the functional layer which is to be interrupted.

For optical functional layers, the layer thicknesses are in the range from 10 to 1000 nm, preferably in the range between 30 and 500 nm. Optical functional layers are optically active layers, i.e. they have a function in terms of their effect on the radiation within a defined region of the electromagnetic spectrum.

Surprisingly, it has been found that very thin interlayers ($\leq 10$ nm) are in most cases of no relevance to the optical design or the spectral reflection characteristics of the layer structure. However, they do prevent undesired morphological structures of an optical functional layer. Therefore, an optical functional layer can be divided up by very thin interlayers without the reflection properties being influenced and is structurally stable even at relatively high temperatures and at a thermal shock.

The thickness of a partial layer can readily be set by a person skilled in the art on the basis of a few tests. It depends firstly on the material used for the optical functional layer and secondly on the expected thermal load on the layer during use. The layer thicknesses of the partial layers $T_s$ which result when an optical functional layer is divided up should be 10 to 70 nm, preferably 20 to 45 nm. If a single interruption to the functional layer does not result in a satisfactory action, on account of an excessive layer thickness of the partial layers or for some other reason, a plurality of interlayers will be used. The partial layers which are formed do not have to have the same thickness, but rather may have different layer thicknesses, i.e. may be formed asymmetrically. The function of an individual optical functional layer is determined substantially only by the total thickness of its partial layers. As soon as the partial layers have the (low) thickness required for the desired application, a further reduction in the layer thickness of the partial layers by adding further interlayers does not lead to any significant improvement. Layer thicknesses of partial layers in the range from 45 to 70 nm should only be used for objects which are exposed to a thermal load of around 350° C. In the layer thickness range from 20 to 45 nm, there is no deterioration to the properties even at very high temperatures of over 350° C.

The layer thickness of the interlayer for optical functional layers should range from 0.3 to 10 nm, preferably from 1 to 3 nm, particularly preferably from 1.5 to 2.5 nm. These parameters ensure that the interlayer influences only the morphology of the layer but not the optical design. At less than 0.3 nm, the interlayer has scarcely any effect, while at above 10 nm the interlayer may undesirably become optically active.

The principle of interrupting the functional layers with interlayers can be applied to any desired combinations of materials in the functional layers. By way of example, in alternating optical layer systems functional layers with a low refractive index can be broken up by interlayers made from the material with a high refractive index, and functional layers with a high refractive index can be broken up by interlayers made from the material having a low refractive index. However, this procedure is not absolutely imperative, but rather is merely sensible in terms of process engineering aspects. It is therefore also possible for the functional layer with a high refractive index to be interrupted by a different interlayer which likewise has a high refractive index, for example for a titanium oxide functional layer to be interrupted by a titanium aluminum oxide interlayer.

Suitable materials for optical functional layers are mainly metal oxides, in particular titanium oxide, titanium aluminum oxide and zirconium oxide in a thermally stable crystal phase for the functional layers with a high refractive index and in particular silicon oxide for the functional layers with a low refractive index.

A further advantageous aspect of the invention is that, for example in the case of optical functional layers applied in crystalline form, interrupting these functional layers with interlayers allows their surface quality to be significantly improved. In addition to an increased thermal stability, surfaces with a high brilliance and improved optical properties as well as an increased resistance to mechanical loads are achieved. Furthermore they haven't no delamination appearances at all. Interlayers also can compensate inner stress of functional layer at thermal shocks.

Further functional layers made from metal, for example for surface coatings of components, in particular carrier elements used in lithographic processes, can advantageously be interrupted by interlayers made from metal oxides, in particular made from metal oxides of the same metal. For example, by interrupting chromium functional layers with chromium oxide interlayers, it is possible to significantly improve the quality of coatings of this type by providing significantly smoother surfaces.

The object which is to be coated may be either a metal or a dielectric substrate, i.e. a glass, a glass-ceramic or a composite. However, it is also possible for the substrate used to be a plastic which is stable under the temperatures of use, such as for example COC (cyclo-olefin-copolymers), PES (polyethersulfone), PEI (polyetherimide), COP (cyclo-olefin polymers) or derivatives, mixtures, copolymers and blends of the abovementioned substances.

However, it is also possible for all other plastics to be used as substrate for the coated object according to the invention.

The invention also relates to the use of a coated object of this type, the objects being suitable in particular for use under a high thermal load. Coated objects of this type are typically used for optical elements. These may be reflectors, lenses, filters, prisms and mirrors. Illumination means for digital projection, stage lighting or architectural lighting are also conceivable. According to the invention, the optical elements can also be used for the UV wavelength region and for the IR wavelength region. Uses as a display for monitors and display units is also possible, given a suitable choice of substrate and layer materials.

If the functional layers are protective layers, for example hard-material protective layers as what are known as "scratchproof layers", their layer thicknesses are typically in the range from 100 to 20,000 nm, preferably between 500 and 10,000 nm and particularly preferably between 1500 and 5000 nm.

The thickness of a partial layer can in this case likewise easily be set by a person skilled in the art on the basis of a few tests. It depends primarily on the material used for the protective layer. The layer thicknesses of the partial layers which result when splitting a functional layer of this type with the interlayer should amount to 30 to 500 nm, preferably 100 to 250 nm. If interrupting the functional layer once does not achieve a satisfactory effect on account of an excessive layer thickness of the partial layers or for some other reason, a plurality of interlayers will be used. The partial layers which are formed do not have to be of the same layer thickness, but rather may have different layer thicknesses, i.e. may be formed asymmetrically.

The interlayers in the protective layers must be very thin layers compared to the functional layer, with thicknesses in the range from 0.3 to 10 nm, preferably in the range from 1 to 5 nm.

In the case of crystalline protective layers, for example, by interrupting the columnar structures which grow with interlayers, it is possible to restrict the lateral extent of the columns to ranges of below 1 μm, preferably even below 200 nm, so that the layers become very dense.

Suitable materials of functional layers of this type as protective layers, in particular for transparent protective layers, are silicon nitride and metal oxides, in particular zirconium oxide in a thermally stable crystal phase, for example yttrium-stabilized zirconia. By way of example, zirconium nitride, silicon oxide or titanium aluminum oxide are used for the interlayers which form the interruption.

The object to be coated with a protective layer may either be a glass, a glass-ceramic or a composite. However, it is also possible for other suitable materials to be used as substrate for the coated object according to the invention.

The invention also relates to the use of a coated object of this type, the objects being suitable in particular for use under high thermal loads. Coated objects of this type are typically used as cooking plates for cooking hobs.

A further coated object according to the invention, comprising a substrate having at least one functional layer, is designed in such a way that at least one functional layer has at least one interlayer which is different than the functional layer, the interlayer having the same refractive index as the functional layer and the interlayer interrupting the morphology of the functional layer.

The interruption to the functional layer with an interlayer which is required here in principle has the same effect on the morphology of the functional layer as described above, but no longer has to have the small thickness of less than 10 nm. Since the interlayer has the same refractive index as the functional layer, it cannot change the optical function of the latter. This is important in particular for transparent functional layers with protective functions and for optical functional layers.

Transparent functional layers with protective functions and/or optical functional layers consist mainly of metal oxides. The interruption with an interlayer which has the same refractive index is in this case preferably achieved by using interlayers made from suitable metal oxides having at least two metallic components, it being possible to match the quantitative ratio of the components and to set a specific refractive index.

Analogously, functional layers made from metal oxides with at least two metallic components are interrupted by interlayers made from a metal oxide.

One possible and suitable embodiment is, for example, for zirconium oxide functional layers to be interrupted by titanium aluminum oxide interlayers, and vice versa.

The refractive index of zirconium oxide is approx. 2.1, and the refractive index of titanium aluminum oxide can be varied within a range from approx. 1.55 to 2.50 by adjusting the ratio of aluminum to titanium. By using a targeted quantitative ratio of the two metallic components, it is possible to match the refractive index of the titanium aluminum oxide layer to the refractive index of the zirconium oxide layer.

This procedure can also be applied analogously for further metal oxides.

Suitable processes for producing the coated objects described are chemical vapor deposition (CVD) or physical vapor deposition (PVD).

The three main techniques used in CVD are thermal CVD, plasma CVD and laser CVD. They differ in terms of the nature of excitation and decomposition of the chemical precursors which function as vaporizable carriers for components of the layer materials.

One of the variants of plasma CVD is advantageous for the production of the object described in the introduction, in particular when producing amorphous functional layers, namely plasma-assisted chemical vapor deposition (PACVD), plasma-enhanced chemical vapor deposition (PECVD), and particularly advantageous plasma impulse chemical vapor deposition (PICVD). In the latter process, the layer deposition takes place discontinuously in a plasma excited by pulsed microwave radiation. A targeted layer build-up of the respective functional layers and the interlayer is controlled by means of the number of pulse cycles. The lowest layer thickness, which can be deposited in precisely one pulse cycle, can be set to 0.1 to 0.3 nm per pulse.

In the case of PICVD, the production outlay is dependent on the total assembly thickness, rather than on the number of different layers. The changeover time from layer to layer in the case of PICVD is approx. 10 milliseconds. This is a particularly economically advantageous process, since in other production processes the production costs increase with the number of different layers, i.e. the number of layers forms the focal point of production costs.

Physical vapor deposition processes with high levels of energy introduced, such as for example sputtering processes, are especially suitable for the production of crystalline layer morphologies.

However, not all sputtering processes are economically suitable for industrial coatings. In this respect, magnetron processes are particularly suitable for the production of objects according to the invention. Magnetron sputtering systems allow high coating rates in the low pressure range with relatively little heating of the substrate and can likewise be successfully controlled in terms of the process parameters.

Sputtering processes are particularly suitable for the production of layers from mixed systems in which simultaneous sputtering using two sputtering sources (co-sputtering) to which different target materials are fitted can be carried out.

The text which follows describes exemplary embodiments of a coated object according to the invention, although the object is not limited to these embodiments.

DETAILED DESCRIPTION OF THE INVENTION

Figure 1:
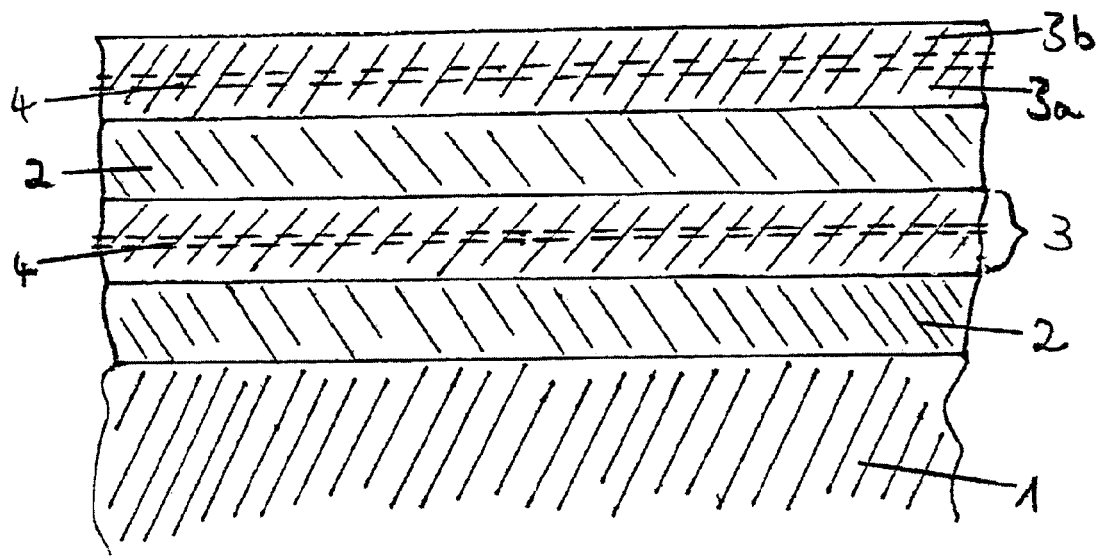
FIG. 1 shows a cross section through a coated substrate with a symmetrical division of functional layers.

FIG. 1 shows a cross section through a particularly preferred embodiment of the coated substrate (1) according to the invention. The layer (2) which is applied direct to the substrate forms a functional layer B, the features and dimensions of which do not include any inventive element. This is followed by the functional layer A (3), which is divided into the partial layers $T_s$ (3a and 3b) by the interlayer (4).

As can be seen with reference to FIG. 1, a further functional layer B can be applied to the split functional layer A. This succession of layers is to be repeated until the desired coating action has been achieved.

Figure 2:
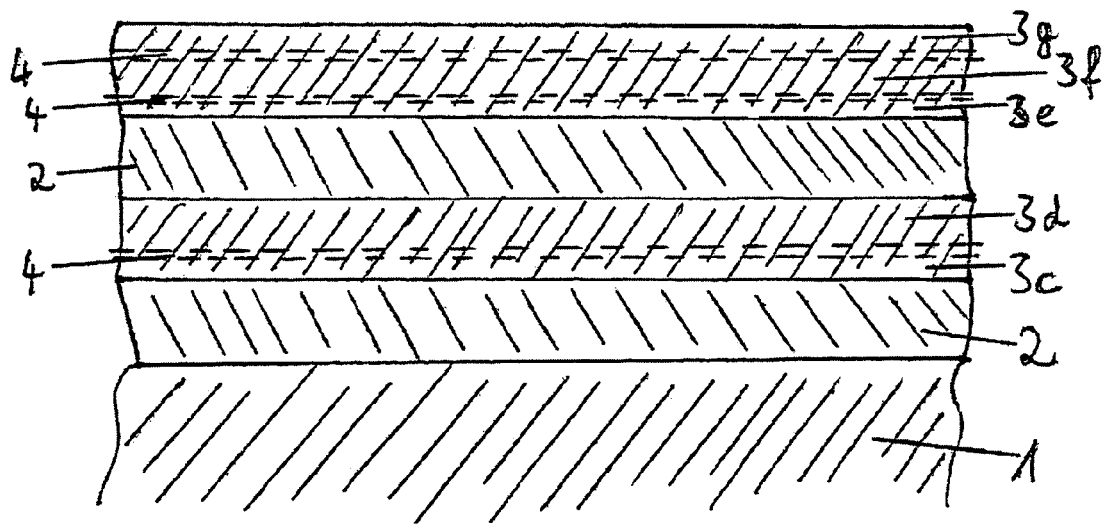
FIG. 2 shows a cross section through a coated substrate with an asymmetrical division of functional layers.

FIG. 2 shows a further embodiment, in which the functional layer A (3) is asymmetrically divided into partial layers $T_s$ (3c and 3d). Furthermore, FIG. 2 shows the possibility of dividing the functional layer A a number of times, in this example into the partial layers $T_s$ (3e, 3f, 3g).

The text which follows compares in each case a example for the coating with (Table 2) and without (Table 1) the interlayers on the basis of a cold-light layer design on a reflector.

The coated object comprises an alternating optical layer system with $SiO_2$ layers, which are optical functional layers with a low refractive index and with $TiO_2$ layers, which are optical functional layers with a high refractive index.

The layer 1 described in the tables is closest to the substrate.

TABLE 1

25 optical functional layers on a glass substrate without interlayers to form a cold-light reflector

| Layer # | Material | Thickness [nm] | Type of layer |
|---|---|---|---|
| 1. | $SiO_2$ | 26.91 | Functional layer B |
| 2. | $TiO_2$ | 102.96 | Functional layer A |
| 3. | $SiO_2$ | 62.79 | Functional layer B |
| 4. | $TiO_2$ | 80.00 | Functional layer A |
| 5. | $SiO_2$ | 127.71 | Functional layer B |
| 6. | $TiO_2$ | 64.62 | Functional layer A |
| 7. | $SiO_2$ | 118.09 | Functional layer B |
| 8. | $TiO_2$ | 68.30 | Functional layer A |
| 9. | $SiO_2$ | 120.00 | Functional layer B |
| 10. | $TiO_2$ | 63.40 | Functional layer A |
| 11. | $SiO_2$ | 108.32 | Functional layer B |
| 12. | $TiO_2$ | 60.44 | Functional layer A |
| 13. | $SiO_2$ | 165.62 | Functional layer B |
| 14. | $TiO_2$ | 32.39 | Functional layer A |
| 15. | $SiO_2$ | 85.95 | Functional layer B |
| 16. | $TiO_2$ | 40.00 | Functional layer A |
| 17. | $SiO_2$ | 93.54 | Functional layer B |
| 18. | $TiO_2$ | 53.32 | Functional layer A |
| 19. | $SiO_2$ | 99.06 | Functional layer B |
| 20. | $TiO_2$ | 52.66 | Functional layer A |
| 21. | $SiO_2$ | 80.48 | Functional layer B |
| 22. | $TiO_2$ | 46.28 | Functional layer A |
| 23. | $SiO_2$ | 82.98 | Functional layer B |
| 24. | $TiO_2$ | 31.65 | Functional layer A |
| 25. | $SiO_2$ | 18.42 | Functional layer B |

TABLE 2

25 optical functional layers with 20 interlayers on a glass substrate to form a cold-light reflector

| Layer # | Material | Thickness [nm] | Type of layer |
|---|---|---|---|
| 1. | $SiO_2$ | 26.91 | Functional layer B |
| 2. | $TiO_2$ | 34.32 | Partial layer $A_n$ |
| 3. | $SiO_2$ | 2.00 | Interlayer |
| 4. | $TiO_2$ | 34.32 | Partial layer $A_n$ |
| 5. | $SiO_2$ | 2.00 | Interlayer |
| 6. | $TiO_2$ | 34.32 | Partial layer $A_n$ |
| 7. | $SiO_2$ | 62.79 | Functional layer B |
| 8. | $TiO_2$ | 40.00 | Partial layer $A_n$ |
| 9. | $SiO_2$ | 2.00 | Interlayer |
| 10. | $TiO_2$ | 40.00 | Partial layer $A_n$ |
| 11. | $SiO_2$ | 127.71 | Functional layer B |
| 12. | $TiO_2$ | 32.31 | Partial layer $A_n$ |
| 13. | $SiO_2$ | 2.00 | Interlayer |
| 14. | $TiO_2$ | 32.31 | Partial layer $A_n$ |
| 15. | $SiO_2$ | 118.09 | Functional layer B |
| 16. | $TiO_2$ | 34.15 | Partial layer $A_n$ |
| 17. | $SiO_2$ | 2.00 | Interlayer |
| 18. | $TiO_2$ | 34.15 | Partial layer $A_n$ |
| 19. | $SiO_2$ | 120.00 | Functional layer B |
| 20. | $TiO_2$ | 31.70 | Partial layer $A_n$ |
| 21. | $SiO_2$ | 2.00 | Interlayer |
| 22. | $TiO_2$ | 31.70 | Partial layer $A_n$ |
| 23. | $SiO_2$ | 108.32 | Functional layer B |
| 24. | $TiO_2$ | 30.22 | Partial layer $A_n$ |
| 25. | $SiO_2$ | 2.00 | Interlayer |
| 26. | $TiO_2$ | 30.22 | Partial layer $A_n$ |
| 27. | $SiO_2$ | 165.62 | Functional layer B |
| 28. | $TiO_2$ | 32.39 | Functional layer A |
| 29. | $SiO_2$ | 85.95 | Functional layer B |
| 30. | $TiO_2$ | 40.00 | Functional layer A |
| 31. | $SiO_2$ | 93.54 | Functional layer B |
| 32. | $TiO_2$ | 26.66 | Partial layer $A_n$ |
| 33. | $SiO_2$ | 2.00 | Interlayer |
| 34. | $TiO_2$ | 26.66 | Partial layer $A_n$ |
| 35. | $SiO_2$ | 99.06 | Functional layer B |
| 36. | $TiO_2$ | 26.33 | Partial layer $A_n$ |
| 37. | $SiO_2$ | 2.00 | Interlayer |
| 38. | $TiO_2$ | 26.33 | Partial layer $A_n$ |
| 39. | $SiO_2$ | 80.48 | Functional layer B |
| 40. | $TiO_2$ | 23.14 | Partial layer $A_n$ |
| 41. | $SiO_2$ | 2.00 | Interlayer |
| 42. | $TiO_2$ | 23.14 | Partial layer $A_n$ |
| 43. | $SiO_2$ | 82.98 | Functional layer B |
| 44. | $TiO_2$ | 31.65 | Functional layer A |
| 45. | $SiO_2$ | 18.42 | Functional layer B |

Figure 3:
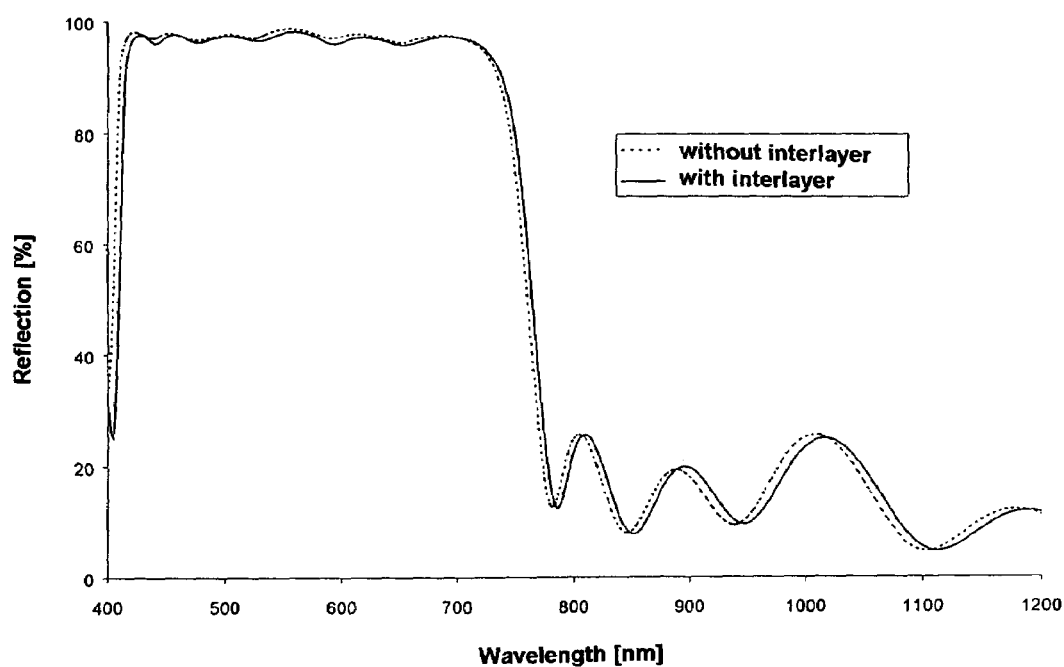
FIG. 3 shows reflection characteristics of an example of a reflector with and without interlayers.

The graph shown in FIG. 3 shows the spectral characteristics of the reflector without interlayers (Table 1) as a dashed line and the spectral characteristics of the reflector with interlayers (Table 2) as a solid line. As can be seen, the interlayers cause only a minimal change to the spectrum, and in any case this change can be substantially compensated for by slightly varying the layer thicknesses. However, a reflector with interlayers can be used at significantly higher operating temperatures while retaining the same optical quality.

The text which follows shows a second example for the coating with interlayers on the basis of chromium layer design on a carrier element for lithografic processes.

The functional chromium layer with a layer thickness of 270 nm is interrupted eight times by an interlayer contains chromium oxide with a layer thickness of approx. 1 nm. This mirror has very high optical quality, a low roughness and porosity. The roughness $R_a$ of a chromium functional layer which is interrupted by interlayers is half as big as the roughness $R_a$ of a chromium functional layer without interlayers. The roughness $R_a$ of a chromium functional layer which is interrupted by interlayers is approx. 1 nm.

In a third example is the functional layer a transparent hard-material protective layer for a cooking plate, known as "scratchproof layer". The layer thickness of this functional layer is 2.01 μm and the layer is made from yttrium-stabilized $ZrO_2$ in a thermally stable crystal phase with 4 mol % $Y_2O_3$.

The layer thicknesses of the 13 partial layers which result when splitting a functional layer of this type with 12 interlayers have a layer thickness of 5 nm is 150 nm.

Silicon oxide are used for the interlayers which form the interruption. The object to be coated with this protective layer is a glass-ceramic plate.

A coated object of this type being suitable in particular for use under high thermal loads. Coated objects of this type are typically used as cooking plates for cooking hobs.

The invention claimed is:

1. A coated object, comprising:
   a substrate having at least one functional layer; and
   at least one interlayer being arranged in said at least one functional layer, said at least one interlayer having a layer thickness of less than or equal to 10 nm interrupting the morphology of said at least one functional layer, and dividing said at least one functional layer in a plurality of partial layers,
   wherein said at least one functional layer comprises a plurality of functional layers defining an alternating optical layer system, said alternating optical layer system comprising a high refractive index layer and a low refractive index layer, and
   wherein said low refractive index layer is interrupted by a plurality of interlayers with a high refractive index.

2. The coated object as claimed in claim 1, wherein said high refractive index layer comprises one element selected from the group consisting of titanium oxide, titanium aluminum oxide, and zirconium oxide.

3. The coated object as claimed in claim 1, wherein said high refractive index layer comprises one element selected from the group consisting of titanium oxide, titanium aluminum oxide, and zirconium oxide.

4. The coated object as claimed in claim 1, wherein said low refractive index layer comprises silicon oxide.

5. The coated object as claimed in claim 1, wherein said plurality of interlayers with a low refractive index comprise silicon oxide.

6. The coated object as claimed in claim 1, wherein said substrate comprises glass.

7. The coated object as claimed in claim 1, wherein the coated object is useable as an optical element selected from the group consisting of a reflector for digital projection, a lens for digital projection, a mirror for digital projection, an illumination means for digital projection, a reflector for stage, a lens for stage, an illumination means for stage, a reflector for architectural lighting, a lens for architectural lighting, an illumination means for architectural lighting, a prism for the UV wavelength region, a lens for the UV wavelength region, a mirror for the UV wavelength region, a reflector for the UV wavelength region, a filter for the UV wavelength region, an illumination means for the UV wavelength region, a prism for the IR wavelength region, a lens for the IR wavelength region, a mirror for the IR wavelength region, a reflector for the IR wavelength region, a filter for the IR wavelength region, an illumination means for the IR wavelength region, a display for monitors, and a display unit.

8. A coated object, comprising:
   a substrate having at least one functional layer; and
   at least one interlayer being arranged in said at least one functional layer, said at least one interlayer having a layer thickness of less than or equal to 10 nm interrupting the morphology of said at least one functional layer, and dividing said at least one functional layer in a plurality of partial layers,
   wherein said at least one functional layer is made from a metal and said at least one interlayer is made from a metal oxide, and
   wherein said at least one functional layer comprises chromium and said at least one interlayer comprises chromium oxide.

9. A coated object, comprising:
   a substrate having at least one functional layer; and
   at least one interlayer being arranged in said at least one functional layer, said at least one interlayer having a layer thickness of less than or equal to 10 nm interrupting the morphology of said at least one functional layer, and dividing said at least one functional layer in a plurality of partial layers,
   wherein said at least one functional layer is made from a metal and said at least one interlayer is made from a metal oxide, and
   wherein the coating object is useable as a carrier element for lithographic processes.

10. A coated object, comprising:
    a substrate having at least one protective functional layer, said at least one protective functional layer having a layer thickness between 100 and 20,000 nm, having a predominantly crystalline layer in a thermally stable crystal phase, and having at least one interlayer arranged therein, said at least one interlayer having a different morphology than said at least one protective functional layer, having a layer thickness less than or equal to 10 nm, and dividing said at least one protective functional layer in a plurality of partial layers so that said plurality of partial layers have a layer thickness between 30 and 500 nm, said at least one functional layer comprises at least one chloride and at least one element selected from the group consisting of an oxide, a nitride, a carbide, a selenide, a telluride, and a sulfide.

11. The coated object as claimed in claim 10, wherein said plurality of partial layers have a layer thickness in the range from 100 to 250 nm.

12. The coated object as claimed in claim 10, wherein said at least one interlayer has a layer thickness in the range from 0.3 to 10 nm.

13. The coated object as claimed in claim 10, wherein said at least one interlayer has a layer thickness in the range from 1 to 5 nm.

14. The coated object as claimed in claim 10, wherein said protective layer has a morphology with a plurality of columns which, on average, have a lateral extent of less than 1 µm.

15. The coated object as claimed in claim 10, wherein said protective layer has a morphology with a plurality of columns which, on average, have a lateral extent of less than 200 nm.

16. The coated object as claimed in claim 10, wherein said protective layer comprises silicon nitride.

17. The coated object as claimed in claim 10, wherein said protective layer comprises zirconium oxide in a thermally stable crystal phase.

18. The coated object as claimed in claim 10, wherein said at least one interlayer comprises one element selected from the group consisting of zirconium nitride, silicon oxide, and titanium aluminum oxide.

19. The coated object as claimed in claim 10, wherein said substrate comprises glass.

20. The coated object as claimed in claim 10, wherein the coated objected is useable as a cooking plate for a cooking hob.

21. A diffusion-inhibiting container, comprising:
    a substrate;
    a functional layer disposed on said substrate; and
    an interlayer arranged in said functional layer, wherein said interlayer has a layer thickness of less than or equal to 10 nm, interrupts the morphology of said functional layer, and divides said functional layer in a plurality of partial layers.

* * * * *